United States Patent
Mangrum et al.

(10) Patent No.: US 7,808,258 B2
(45) Date of Patent: Oct. 5, 2010

(54) TEST INTERPOSER HAVING ACTIVE CIRCUIT COMPONENT AND METHOD THEREFOR

(75) Inventors: Marc A Mangrum, Manchaca, TX (US); Kenneth R Burch, Austin, TX (US); David T Patten, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 135 days.

(21) Appl. No.: 12/146,552

(22) Filed: Jun. 26, 2008

(65) Prior Publication Data

US 2009/0322364 A1 Dec. 31, 2009

(51) Int. Cl.
G01R 1/02 (2006.01)
G01R 1/073 (2006.01)
G01R 31/28 (2006.01)

(52) U.S. Cl. ........................ 324/755; 324/765
(58) Field of Classification Search .............. None
See application file for complete search history.

(56) References Cited

U.S. PATENT DOCUMENTS

| | | |
|---|---|---|
| 6,452,807 B1 | 9/2002 | Barrett |
| 6,978,538 B2 | 12/2005 | DiStefano et al. |
| 7,088,118 B2 | 8/2006 | Liu et al. |
| 7,396,236 B2* | 7/2008 | Eldridge et al. ............ 439/66 |
| 7,443,021 B2* | 10/2008 | Nakatani .................. 257/700 |
| 2002/0094683 A1* | 7/2002 | Su et al. .................. 438/689 |
| 2003/0099097 A1 | 5/2003 | Mok et al. |
| 2005/0133935 A1* | 6/2005 | Vasishta et al. .......... 257/782 |
| 2005/0184748 A1 | 8/2005 | Chen et al. |
| 2007/0075717 A1 | 4/2007 | Kinghorn et al. |

FOREIGN PATENT DOCUMENTS

| | | |
|---|---|---|
| JP | 05-267393 | 10/1993 |
| JP | 2000-040572 | 8/2000 |

OTHER PUBLICATIONS

PCT/US2009/039635 International Search Report and Written Opinion mailed Oct. 28, 2009.

* cited by examiner

*Primary Examiner*—Paresh Patel

(57) ABSTRACT

A device under test (DUT) is tested via a test interposer. The test interposer includes a first set of contacts at a first surface to interface with the contacts of a load board or other interface of an automated test equipment (ATE) and a second set of contacts at an opposing second surface to interface with the contacts of the DUT. The second set of contacts can have a smaller contact pitch than the contact pitch of the first set of contacts to facilitate connection to the smaller pitch of the contacts of the DUT. The test interposer further includes one or more active circuit components or passive circuit components to facilitate testing of the DUT. The test interposer can be implemented as an integrated circuit (IC) package that encapsulates the circuit components.

20 Claims, 5 Drawing Sheets

TEST INTERPOSER HAVING ACTIVE CIRCUIT COMPONENT AND METHOD THEREFOR

FIELD OF THE DISCLOSURE

The present disclosure relates to integrated circuit testing, and more particularly to test interposers.

BACKGROUND

The operating frequencies and the number of input/output (I/O) signals of integrated circuits are continuously increasing, while the physical dimensions of the I/O signal contacts are continuously decreasing. The cost of implementing test hardware, such as performance boards (also referred to as load boards), increases as the number and density of I/O signal contacts rises. Technology currently available to conduct signaling from the load board to the device under test (DUT) has difficulty supporting the small contact pitch dimensions of modern integrated circuits. Furthermore, the excessive length of test hardware interconnects, particularly those associated with the load board, detract from signal integrity and can limit the frequency at which the integrated circuit can be tested. Accordingly, an improved technique for testing integrated circuit devices with relatively small contact pitches would be advantageous.

BRIEF DESCRIPTION OF THE DRAWINGS

The present disclosure may be better understood, and its numerous features and advantages made apparent to those skilled in the art by referencing the accompanying drawing, in which like reference numbers indicate similar or identical items.

DETAILED DESCRIPTION OF THE PRESENT DISCLOSURE

FIGS. 1-9 illustrate example systems and techniques for testing a device under test (DUT) via a test interposer. The test interposer includes a first set of contacts at a first surface to interface with the contacts of a load board or other interface of an automated test equipment (ATE) and a second set of contacts at an opposing second surface to interface with the contacts of the DUT. In one embodiment, the second set of contacts has a smaller contact pitch than the contact pitch of the first set of contacts to facilitate connection to the smaller pitch of the contacts of the DUT. The test interposer further includes one or more active circuit components or passive circuit components to facilitate testing of the DUT. The test interposer can be implemented as an integrated circuit (IC) package that encapsulates the circuit components. In one embodiment, the test interposer may be fabricated in accordance with a process known as Redistributed Chip Packaging (RCP) process.

Figure 1:
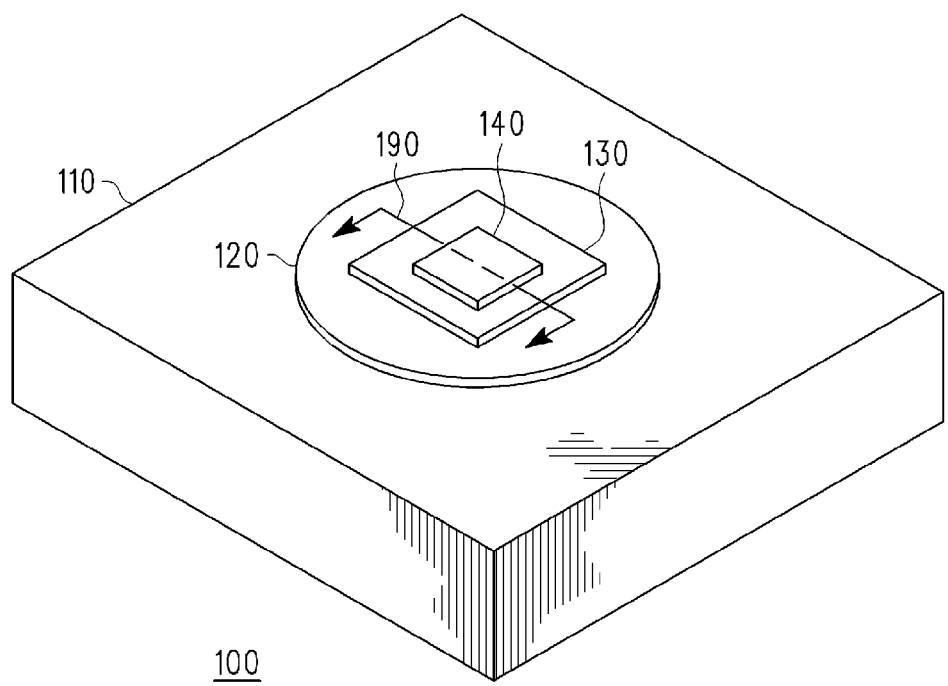
FIG. 1 illustrates components of an integrated circuit test system having a test interposer in accordance with at least one embodiment of the present disclosure.

FIG. 1 illustrates an integrated circuit test system 100 for testing integrated circuit devices in accordance with at least one embodiment of the present disclosure. In the depicted example, integrated circuit test system 100 includes an automatic test equipment (ATE) 110, a load board 120 (also known as a performance board or a personality board), a test interposer 130, and a device under test (DUT) 140.

ATE 110 provides functional verification, manufacturing validation, device characterization, and other electronic test functions in relation to DUT 140. ATE 110 can be self-contained or, more typically, connected via an interface to a computer system or other peripheral electronic hardware. Test equipment such as ATE 110 is available in a wide range of capabilities and can support testing of both digital and analog devices. Attributes commonly provided by ATE include the number of device pins that can be tested and the speed at which the testing can be performed. ATE 110 can execute software routines (commonly referred to as test programs) to verify that DUT 140 conforms to specific logic functionality, electrical parameters, and product specifications. As ATE 110 executes the test program, sequential electrical signals known as patterns or test vectors are applied to the interface pins of DUT 140 (via load board 120 and test interposer 130) and the electrical responses of DUT 140 are received (via the load board 120 and test interposer 130) and compared to expected values that are also part of the complete test program. DUT 140 is then determined to be functional or nonfunctional, and to meet or to fail to meet specific tolerances, based on each comparison in accordance with the device specification. ATE 110 also can perform parametric verification of DUT 140 wherein device attributes such as supply current, signal timing and voltage tolerances are measured and compared to the device specification to determine if the device adheres to various electrical requirements. An example of a commercially available ATE 110 is the Verigy 93000 system produced by Agilent Technologies, Inc.

DUT 140 can include any of a variety of integrated circuit devices capable of being tested. DUT 140 can include a packaged integrated circuit or an integrated circuit in unpackaged wafer form or die form. In certain instances, DUT 140 cannot be directly interconnected to ATE 110 for mechanical or electrical reasons. Accordingly, ATE 110 typically will have a generic interface-to-interface load board 120. Load board 120 typically is a printed circuit board (PCB) and can attach directly to ATE 110 or connect to ATE 110 via signal cabling. Loadboard 120 provides electrical contacts for conducting signaling between ATE 110 and DUT 140. Loadboard 120 typically can include electrical components such as resistors and capacitors that can support parametric electrical verification as well as to provide signal conditioning. Loadboard 120 generally is designed specifically for a single integrated circuit device type or family of similar device types. In the illustrated embodiment, generic implementations of load board 120 can be designed for testing a variety of disparate device types. This is possible because circuitry that configures load board 120 to interface to a specific DUT 140 can be included within test interposer 130 as described in detail herein.

In many instances the contacts of DUT 140 are physically small, closely spaced, and can be of great number and high density. In such instances, it may be difficult if not impossible to directly connect the contacts of DUT 140 to the contacts of load board 120. Accordingly, in at least one embodiment, test interposer 130 is utilized as an interface between load board 120 and DUT 140. Test interposer 130, in one embodiment, is an integrated circuit package that provides one or more testing pathways between load board 120 and DUT 140. Test interposer 130 includes an array of electrical contacts that provide electrical connections to the contacts of DUT 140 on one surface, and includes on the opposing surface another array of electrical contacts to conduct signaling with contacts of load board 120. The number, type, and pitch of the contacts may differ between surfaces of test interposer 130. To illustrate, the array of electrical contacts on the surface facing DUT 140 may be more closely spaced than the array of electrical contacts on the surface facing load board 120, or vice versa.

In one embodiment, test interposer 130 includes one or more passive and active circuit components to facilitate testing of the DUT. Further, test interposer 130 comprises a plurality of dies implementing the circuit components, as well as one or more layers of internal signal routing that interconnect the contacts on each surface as well as the electrical components located at the dies therein. In such instances, test interposer 130 can be fabricated based on the Redistributed Chip Packaging (RCP) process. Alternately, the test interposer 130 can be fabricated based on any of a variety of IC package architectures, including, but not limited to, a Quad Flat No Leads (QFN) architecture, a Ball Grid Array (BGA) architecture, a Land Grid Array (LGA) architecture, a Chip Size (or Scale) Package (CSP) architecture, a Quad Flat Package (QFP) architecture, a Small Outline Integrated Circuit (SOIC) architecture, a J-lead Small Outline (SOJ) package architecture, and the like.

In operation, load board 120 is connected to ATE 110 and test interposer 130 is connected to the contacts of load board 120, either temporarily (e.g., via screws or clamping mechanisms) or permanently (e.g., via soldering of the contacts of one surface of test interposer 130 to the corresponding contacts of load board 120). DUT 140 is selected for testing and a compressive mechanical clamp or automated packaging handler (not shown) aligns DUT 140 with test interposer 130 so as to establish physical and electrical connections between the contacts of DUT 140 and the corresponding contacts of test interposer 130. An example cross-section view 190 of this connection of ATE 110, load board 120, test interposer 130, and DUT 140 is described in detail below with reference to FIG. 2. Once connected in this manner, ATE 110 conducts one or more tests of DUT 140 via signaling conducted between ATE 110 and DUT 140 via load board 120 and test interposer 130. The small physical dimensions of interposer 130 can be advantageous in reducing electrical noise (interference), thus enabling accurate and faster testing of these devices.

As previously described, test interposer 130 can include one or both of active circuit components and passive circuit components to facilitate testing of DUT 140. To illustrate, in one embodiment test interposer 130 can include signal filtering or signal amplification circuitry to improve the fidelity of signals being transmitted to DUT 140 via test interposer 130 or signals being transmitted from DUT 140. As another example, test interposer 130 can include registers or register stacks to buffer data provided to DUT 140 or to buffer data provided by DUT 140. Interposer 130 can include high-speed comparators to determine if the response to stimulus provided to DUT 140 matches the expected value. Active circuit components can implement various functions, such as signal amplification, signal filtering, signal resampling and dejittering, data storage, clock generation, phase alignment, time base or frequency references, or to support the measurement of any of these parameters. Embedded memory components can provide functional and/or parametric lookup tables. Embedded erasable read-only programmable memories (EPROMS) or electrically erasable read-only memories (EEPROMS) can be used to provide/authenticate cryptographic keys to enable the secure testing of DUT 140. Reference ICs can be included to enable accurate testing of analog and radio frequency (RF) devices across a wide frequency range.

Figure 2:
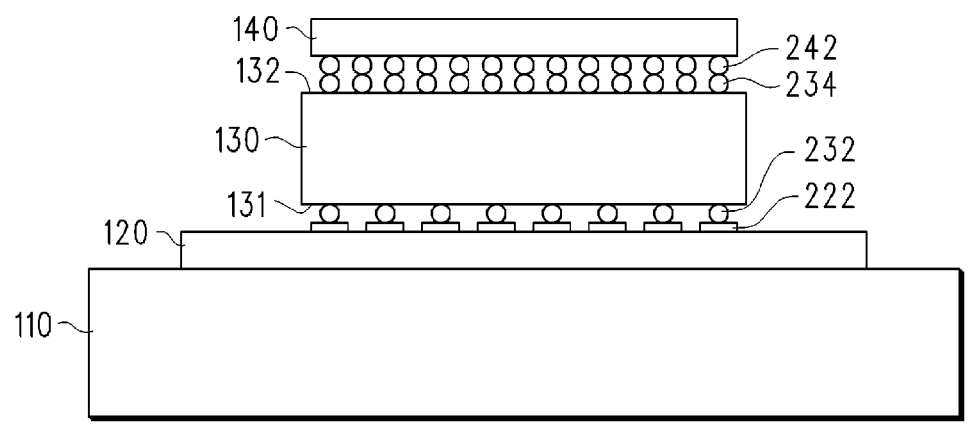
FIG. 2 illustrates a cross-section view of the integrated circuit test system of FIG. 1 in accordance with at least one embodiment of the present disclosure.

FIG. 2 illustrates an example cross-section view 190 of the components of integrated circuit test system of FIG. 1 in accordance with at least one embodiment of the present disclosure. In the depicted example, ATE 110 is connected to load board 120 via electrical connections (not shown). Load board 120, in turn, includes an array of electrical contacts 222 connected to a corresponding array of electrical contacts 232 at the bottom surface (surface 131) of test interposer 130. Another array of electrical contacts 234 at the top surface (surface 132) of test interposer 130 are connected to a corresponding array of electrical contacts 242 of DUT 140 ("bottom" and "top" being relative only to the particular view of the figure). One or more of electrical contacts 232 at surface 131 of test interposer 130 are connected to one or more of electrical contacts 234 at opposing surface 132 of test interposer 130 via internal signal routing structures (e.g., vias, traces, etc.), passive or active circuit components, or a combination thereof provided by test interposer 130, so as to facilitate transmission of signaling between electrical contacts 222 of load board 120 and electrical contacts 242 of DUT 140. Example implementations of test interposer 130 are described below with reference to FIGS. 3-7.

Figure 3:
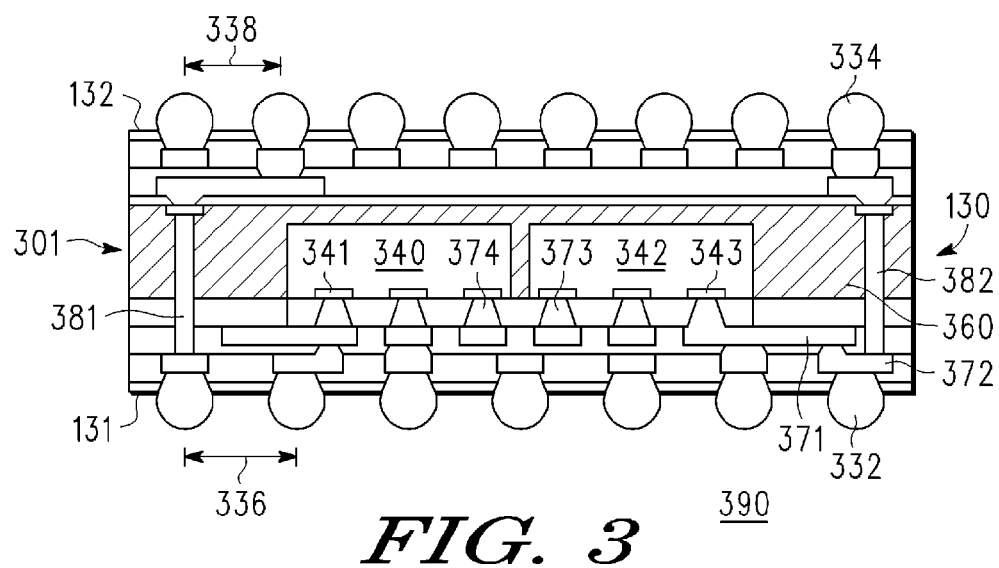
FIG. 3 illustrates a cross-section view of an example test interposer in accordance with at least one embodiment of the present disclosure.

FIG. 3 illustrates a cross-section view 390 (corresponding to cross-section view 190, FIG. 1) of an example implementation of test interposer 130. In the depicted example, test interposer 130 is implemented as an integrated circuit (IC) package 301 comprising an array of electrical contacts 332 disposed at the bottom surface (surface 131) and an array of electrical contacts 334 disposed at the top surface (surface 132). In the example of FIG. 3, electrical contacts 332 and 334 are illustrated as metal balls. Alternate implementations of the electrical contacts are described below with respect to FIGS. 4-7.

Test interposer 130 further includes a plurality of dies (e.g., dies 340 and 342), each die implementing one or more active or passive circuit components, and one or more signal routing layers to connect the plurality of dies to corresponding contacts 332 and 334. The plurality of dies and the one or more routing layers are encapsulated by an encapsulant material 360, such as a silica-filled epoxy molding compound.

In the illustrated embodiment, test interposer 130 is manufactured using a Redistributed Chip Packaging (RCP) process, which supports the construction of single or multi-chip packages or modules and utilizes deposition of copper metallization by electroplating techniques separated by insulating layers comprised of a spin-coated or film photoimageable dielectric, and patterned using batch process lithography. Multiple layers of metallization and dielectric can be provided to achieve the desired routing and interconnect needed by the design. To illustrate, FIG. 3 depicts fabrication of test interposer 130 using a double sided panel RCP process. In this process dies 340 and 342 are encapsulated in encapsulant material 360 to form a panel. One or more dielectric and metalization layers can be formed at one side (e.g., bottom side 131) of the panel and a set of contacts can thereafter be formed at the external surface of the top layer formed on the one side of the panel. During the layer formation process, internal routing features (e.g., traces 371 and 372 and vias 373 and 374) are formed to connect die pads (e.g., die pads 341 and 434) of the dies 340 and 342 to certain ones of the contacts 332 at bottom side 131. The same process can be repeated for the other side (e.g., top side 130) of the panel. In the illustrated example, the die pads of dies 340 and 342 are oriented toward bottom side 131 and contacts 334 at top 131 therefore can be connected to certain die pads of the dies 340 and 342, as well as certain contacts 332 of bottom side 131 using one or more through vias (e.g., through vias 381 and 382).

This design process can be customized for each design to meet any number of requirements. Also, the interconnect pitch may vary as required. For example, the internal build up process may support route and trace requirements from as large as, but not limited to, 100 microns by 100 microns to as small as, but not limited to, 10 microns by 10 microns. The interconnecting vias may also vary from as large as, but not limited to 200 microns to as small as, but not limited to, 10 microns. Interconnections are thus provided without the need for a leadframe and wire-bonding. It should be appreciated that whereas the use of RCP technology is described, other packaging technologies can be utilized to implement test interposer 130 disclosed herein.

In the depicted example, the array of electrical contacts 332 at the bottom surface (surface 131) has a center-to-center contact pitch represented by, but not limited to, dimension 336 and the array of electrical contacts 334 has a center-to-center contact pitch represented by, but not limited to, dimension 338. Dimension 336 can be greater than, less than, or equal to dimension 338. As discussed above, the contacts of DUT 140 may be closely spaced and in great number, making it difficult for load board 120 to connect directly to DUT 140 due to process and manufacturing limitations of load board 120. However, as noted above test interposer 130 can be implemented as an IC circuit package, which can permit the implementation of a finer contact pitch for the array of electrical contacts 334 facing DUT 140 than would be achievable via load board 120. Accordingly, in one embodiment, test interposer 130 is fabricated so that the array of electrical contacts 334 at the top surface (surface 132) has a smaller contact pitch (dimension 338) compatible with the smaller contact pitch of DUT 130, while the array of electrical contacts 332 at the bottom surface (surface 131) has a larger contact pitch (dimension 336) compatible with the larger contact pitch of load board 120 (e.g., dimension 338<dimension 336). In this manner, test interposer 130 can act as a "translator" between the larger contact pitch of load board 120 and the smaller contact pitch of DUT 140. In another embodiment, the contact pitch of the array of contacts 332 may be equal to, or smaller than, the contact pitch of the array of contacts 334 (e.g., dimension 336<=dimension 338).

The circuit components implemented at dies 340 and 342 can include both passive components, such as resistors and capacitors, or any of a variety of active components, such as transistors, microprocessors, first-in first-out (FIFO) buffers, memories, signal processors, analog devices, mixed signal devices, voltage regulators, analog-to-digital (A/D) converters, application specific integrated circuits (ASICs), field programmable logic arrays (FPGAs), and the like. The implementation of these circuit components in test interposer 130 can provide data reduction and pre-processing, signal conditioning, parametric analysis, and other functions previously relegated to ATE 110. By off-loading these functions from ATE 110, the expense and complexity of ATE 110 and load board 120 can be reduced while improving the performance of the test operations on DUT 140.

FIGS. 4, 5, 6 and 7 illustrate examples of types of electrical contacts that can be utilized for conducting signals from test interposer 130 to DUT 140 in accordance with various embodiments of the present disclosure. Specific contact designs can provide advantages depending on the physical form of DUT 140, such as wafer form, die form, or any of a multitude of package forms. To focus on the contact design various, FIGS. 4-7 are simplified illustrations of the interposer 130 without detailed reference to the dies implementing circuit components, the internal signal routing structures, or the encapsulant.

Figure 4:
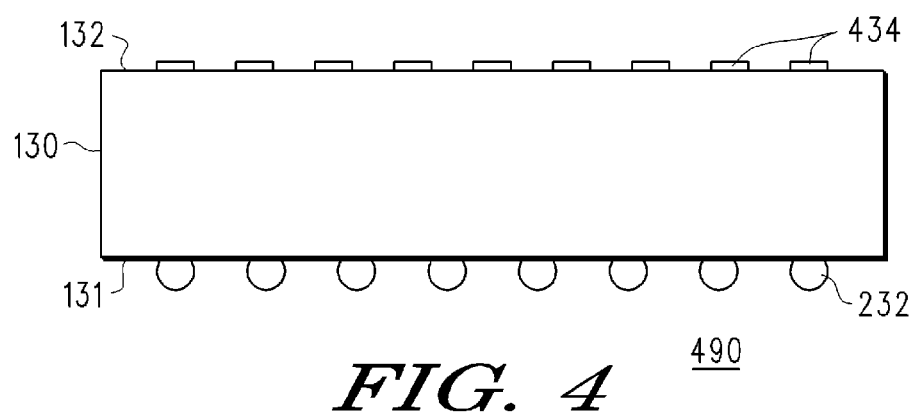
FIG. 4 illustrates a cross-section view of another example test interposer in accordance with at least one embodiment of the present disclosure.

As illustrated by the cross-section view 490 of FIG. 4, the electrical contacts on the top surface (surface 132) of test interposer 130 that faces DUT 140 can be implemented as metal bumps 434 (formed by, e.g., solder deposition and reflow), conductive polymer contacts, dropped solder spheres, and the like). The electrical contacts can include contacts plated with any of a variety of conductive materials, such as nickel-gold, palladium, platinum, etc. These electrical contacts can be connected to the circuit components of test interposer 130 and electrical contacts 222 on the bottom surface (surface 131) facing load board 120 (FIG. 2) via internal signal routing structures of test interposer 130.

Figure 5:
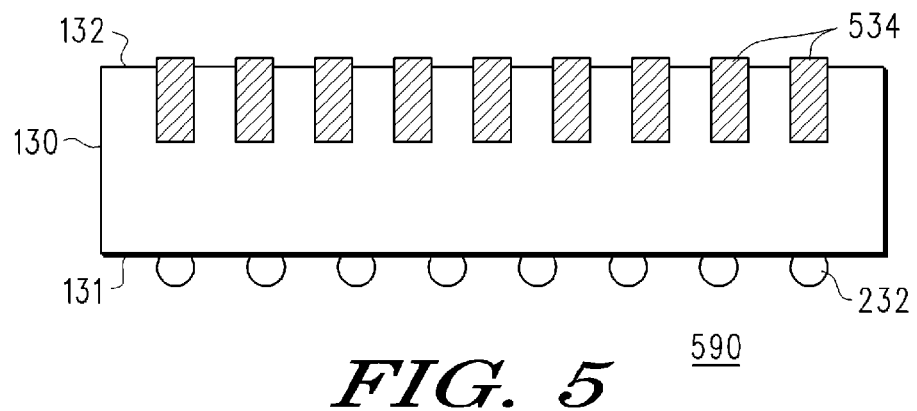
FIG. 5 illustrates a cross-section view of another example test interposer in accordance with at least one embodiment of the present disclosure.

As illustrated by the cross-section view 590 of FIG. 5, the electrical contacts on the top surface (surface 132) of test interposer 130 that faces DUT 140 can be implemented as metal-filled columns 534 connected to the circuit components of test interposer 130 and electrical contacts 222 on the bottom surface (surface 131) facing load board 120 (FIG. 2) via internal signal routing structures of test interposer 130.

Figure 6:
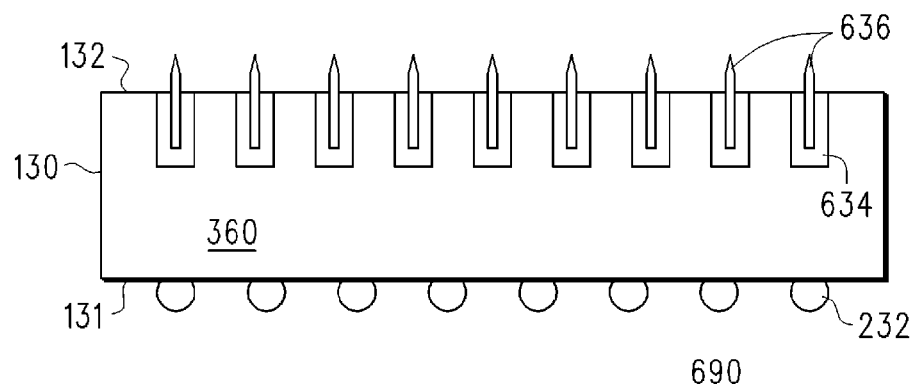
FIG. 6 illustrates a cross-section view of another example test interposer in accordance with at least one embodiment of the present disclosure.

As illustrated by the cross-section view 690 of FIG. 6, the electrical contacts on the top surface (surface 132) of test interposer 130 that faces DUT 140 can be implemented as micro-electrical-mechanical system (MEMS) probes 636 connected to the circuit components of test interposer 130 and electrical contacts 222 on the bottom surface (surface 131) facing load board 120 (FIG. 2) via internal signal routing structures of test interposer 130. In the depicted example, openings 634 can be formed in encapsulant 360 so as to access corresponding internal routing structures from the top surface (surface 132), and MEMS probes 636 can be inserted into these openings 634 with their tips extending above the top surface and their bases making electrical contact with the corresponding internal routing structures. MEMS probes 636 can include intrinsic springs to provide compliancy to facilitate physical and electrical contact between test interposer 130 and a corresponding electrical contact at DUT 140. Non-limiting examples of MEMS probes 636 that can be used advantageously at test interposer 130 are described in U.S. Patent App. Pub. No. 2005/0184748 (U.S. patent application Ser. No. 11/029,180), the entirety of which is incorporated by reference herein.

Figure 7:
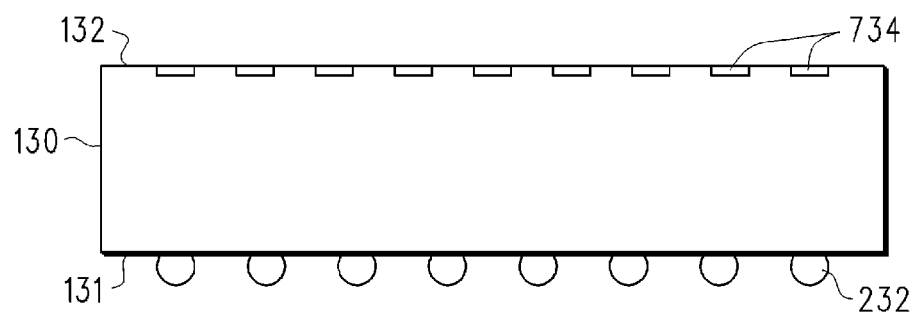
FIG. 7 illustrates a cross-section view of another example test interposer in accordance with at least one embodiment of the present disclosure.

As illustrated by the cross-section view 790 of FIG. 7, the electrical contacts on the top surface (surface 132) of test interposer 130 that faces DUT 140 can be implemented as recessed openings 734, each opening including an electrical contact. These contacts can be formed by etching through the encapsulant material to expose the internal routing layers. The exposed routing layer material can be plated with conductive materials sufficiently durable to support repetitive use in the intended function. As with the contacts of the other example implementations, contacts represented by the recessed openings 734 could be formed or patterned in a grid fashion consistent with the corresponding contacts of DUT 140, or could be formed in an adaptable fashion to enable multiple configurations of DUTs of common contact pitch to be tested using a common interposer design.

Contacts 232 of the bottom surface (surface 131) of test interposer 130 that interface with the corresponding electrical contacts 222 (FIG. 2) of load board 120 can be implemented as metal balls, pins, metal-filled columns, MEMS pins, and the like, in a manner similar to the contacts of the top surface (surface 132) of test interposer 130 that interface with the electrical contacts of DUT 140.

Figure 8:
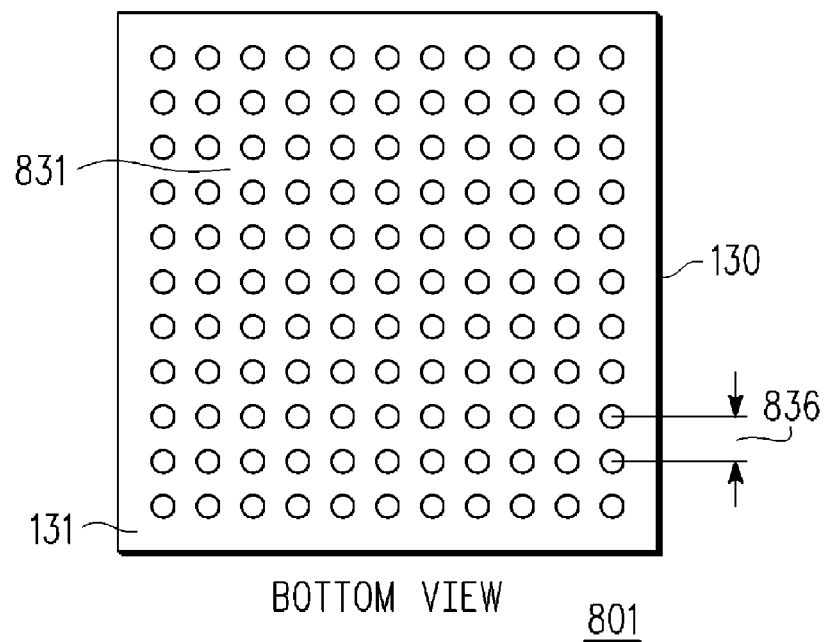
FIG. 8 illustrates a top view and a bottom view of an example test interposer in accordance with at least one embodiment of the present disclosure.
Figure 8:
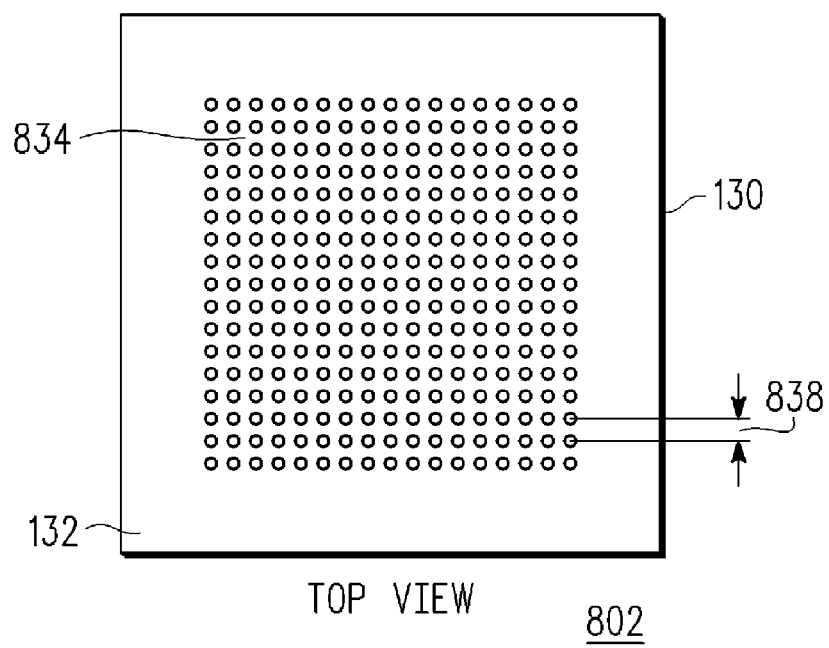

FIG. 8 illustrates a bottom view 801 and a top view 802 of surfaces 131 and 132, respectively, of test interposer 130 in accordance with at least one embodiment of the present disclosure. As illustrated by bottom view 801, the surface 131 of test interposer 130 facing load board 120 (FIG. 1) includes an array of electrical contacts 832 (corresponding to electrical contacts 232 (FIG. 2) and contacts 332 (FIG. 3)) for conducting signals between test interposer 130 and load board 120. The center-to-center contact pitch between adjacent contacts is illustrated by a dimension 836 (corresponding to dimension 336, FIG. 3). As illustrated by top view 802, the surface 132 of test interposer 130 facing DUT 140 (FIG. 1) includes an array of electrical contacts 834 (corresponding to electrical contacts 234, 334, 434, 534, and 634) for conducting signals between test interposer 130 and DUT 140. The center-to-center contact pitch between adjacent contacts 834 is illustrated by a dimension 838 (corresponding to dimension 338, FIG. 3).

In one non-limiting example, dimension 836 can be 0.5 millimeters and dimension 838 can be 125 microns. An interposer can be fabricated to maximize the number of contacts relative to a given interposer body size and the desired contact pitch. To illustrate, given a 17 mm×17 mm interposer body size, a one (1) millimeter contact pitch can accommodate approximately 256 individual contacts, whereas a contact pitch of 0.4 millimeters can accommodate approximately 1680 individual contacts.

Figure 9:
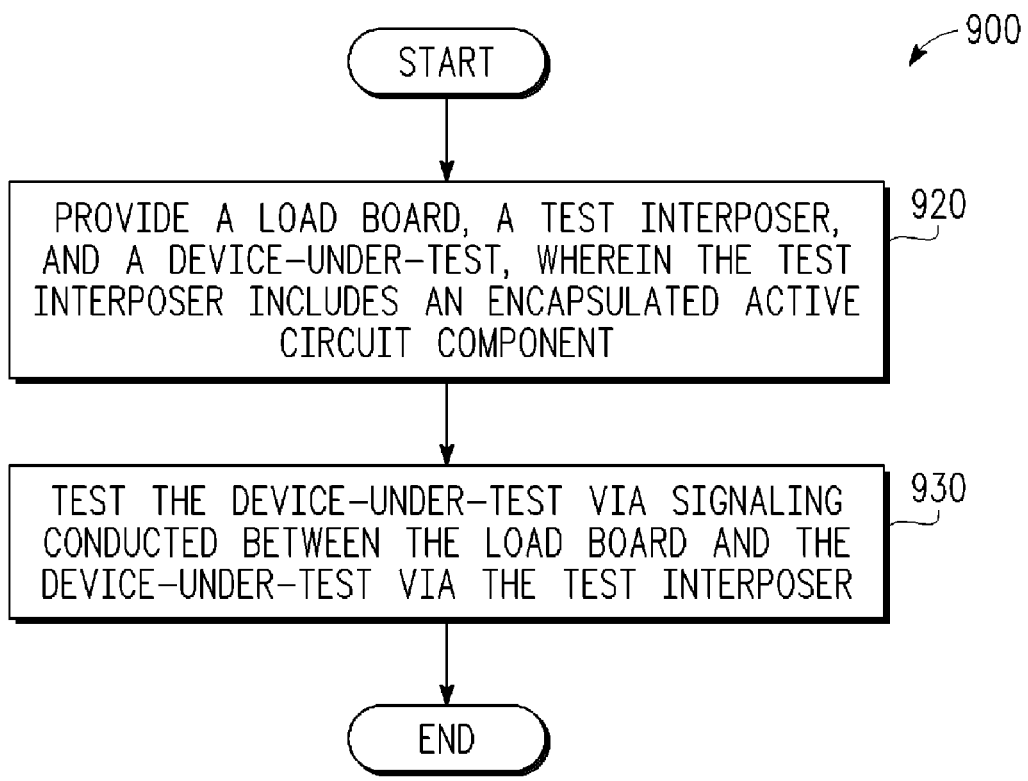
FIG. 9 illustrates a method for testing a device under test via a test interposer in accordance with at least one embodiment of the present disclosure.

The electrical contacts illustrated at FIGS. 3-8 provide a variety of techniques for non-fixedly conducting signals between test interposer 130 and load board 120 and between test interposer 130 and DUT 140. The electrical contacts can be spaced very densely compared to conventional pin arrangements. Although the arrays of contacts are illustrated in FIGS. 2-8 as homogeneous arrays, in other embodiments the arrays of contacts can include multiple contact types (e.g., a combination of metal ball contacts, metal bump contacts, and MEMS probes). Further, while a multitude of electrical contacts are illustrated on either surface of test interposer 130, it should be appreciated that any number of contacts can be provided. The array of contacts 832 can be geometrically arranged to correspond with the arrangement of contacts 222 of load board 120 permitting contacts 832 to conduct signaling with the corresponding array of contacts 222 at load board 120. Likewise, the array of contacts 834 can be geometrically arranged to correspond with the arrangement of contacts 242 of DUT 140 permitting contacts 834 to conduct signaling with the corresponding array of contacts 242 at DUT 140. The array of contacts can be arranged in a manner other than a fully populated rectangle of contacts. Further, the number of contacts 834 can be greater than, equal to, or less than the number of contacts 832. FIG. 9 is a flow diagram that illustrates a method 900 whereby test interposer 130 is used to facilitate the testing of DUT 140 in accordance with at least one embodiment of the present disclosure. At block 920, load board 120, test interposer 130, and DUT 140 are provided and connected as described above with reference to FIGS. 1 and 2 (and utilizing any of the various contact implementations of FIGS. 2-8 or similar contact implementations, or combinations thereof). Method 900 proceeds to block 940, whereby DUT 140 is tested via signaling conducted between load board 120 and DUT 140 via test interposer 130. As described above, test interposer 130 can be implemented as an IC package and thus can facilitate connection to contacts of DUT 140 having a contact pitch smaller than that which would be achievable directly from load board 120.

Further, the incorporation of active and passive circuit components at test interposer 130 can facilitate offloading of some test system functionality previously supported by ATE 110 and load board 120 on to test interposer 130. By redistributing some of the test system functionality to test interposer 130, a number of benefits can be realized. The number of unique data channels required by ATE 110 can be reduced, the operating frequency required of ATE 110 can be reduced, and the time to conduct the test can be shortened, all of which can reduce total testing expense. Standardized or generic load boards can support testing of a multitude of different device types since test interposer 130 can provide the custom functionality and physical pin transformations required to test each unique device type. Another potential benefit realized is the minimization of interconnect length between ATE 110 and DUT 140, which improves signal integrity, limits timing skew, and allows for testing at higher operating frequencies.

Although a single test interposer is illustrated in the Figures for ease of discussion, a second or even multiple test interposers can be stacked to further distribute test system functionality without departing from the scope of the present disclosure. Alternatively, a single test interposer can be designed by integrating multiple existing functions together into one encapsulated package, similar to present day system-on-a-chip (SOC) design techniques. Additional openings can be provided at either surface of test interposer 130 which can allow access to internal interconnect layers for interfacing to a wide variety of indicators and peripheral electronic devices.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:
1. A system comprising:
   a test interposer comprising:
      an integrated circuit package comprising:
         a first surface and a second surface;
         a first array of contacts disposed at the first surface, each contact of the first array of contacts configured to electrically connect to a corresponding contact of a second array of contacts of a load board, the load board coupled to a testing equipment;
         a third array of contacts disposed at the second surface, each contact of the third array of contacts configured to electrically connect to a corresponding contact of a fourth array of contacts of a device under test (DUT);
a first die;
a second die separate from the first die;
an active circuit component disposed at the first die, the active circuit component coupled to a first contact of the first array of contacts and a second contact of the third array of contacts; and
an encapsulant overlying the first die, the second die, and the active circuit component.

2. The system of claim 1, wherein the active circuit component comprises one selected from a group consisting of: a memory component; a microprocessor component; a digital signal processor component; an analog-to-digital (A/D) converter; an application specific integrated circuit (ASIC); and a field programmable logic array (FPGA).

3. The system of claim 1, wherein:
the first array of contacts is arranged to have a first contact pitch; and
the third array of contacts is arranged to have a second contact pitch, the second contact pitch smaller than the first contact pitch.

4. The system of claim 1, further comprising:
the load board; and
the DUT.

5. The system of claim 1, wherein the third array of contacts comprises one selected from a group consisting of: an array of metal bumps; an array of metal balls; an array of metal columns; an array of recessed contacts; an array of micro-electrical-mechanical system (MEMS) probes; and an array of metal-filled columns.

6. The system of claim 1, wherein:
the first die comprises a set of die pads disposed at a surface of the first die; and
the test interposer further comprises an interconnects to connect a die pad of the set of die pads to at least one of a contact of the first array of contacts or a contact of the third array of contacts.

7. The system of claim 1, wherein the active circuit component implements at least one of: a signal amplification function; a signal filtering function; a signal resampling function; a dejittering function; a data storage function; a clock generation function; and a phase alignment function.

8. The system of claim 1, wherein the encapsulant comprises an epoxy molding compound.

9. A method comprising:
providing a load board and a test interposer, the load board comprising a first array of contacts and the test interposer comprising an integrated circuit package having a first surface facing the first array of contacts of the load board and a second surface facing a second array of contacts of a device under test (DUT), the test interposer further comprising a third array of contacts electrically connected to the first array of contacts of the load board and a fourth array of contacts electrically connected to the second array of contacts of the DUT, and the integrated circuit package having a first die and a second die separate from the first die, an active circuit component disposed at the first die, and an encapsulant overlying the first die, the second die, and the active circuit component, the active circuit component coupled to a first contact of the third array of contacts and to a second contact of the fourth array of contacts; and
testing the DUT via signaling conducted between the load board and the DUT via the test interposer.

10. The method of claim 9, wherein:
testing the DUT comprises controlling an operation of the active circuit component based on signaling received at the test interposer via at least one of the first contact and the second contact.

11. The method of claim 9, wherein:
providing the load board and the test interposer comprises providing the test interposer comprising a passive circuit component encapsulated the integrated circuit package, the passive circuit component coupled to a third contact of the third array of contacts and to a fourth contact of the fourth array of contacts; and
testing the DUT comprises conducting signaling between the third contact and the fourth contact via the passive circuit component.

12. The method of claim 9, wherein providing the test interposer comprises providing the test interposer having the fourth array of contacts arranged to have a first contact pitch the third array of contacts arranged to have a second contact pitch, the second contact pitch smaller than the first contact pitch.

13. The method of claim 9, wherein providing the test interposer comprises fabricating the test interposer using a Redistributed Chip Packaging (RCP) process.

14. The method of claim 9, wherein testing the DUT comprises operating the active circuit component to perform least one of: a signal amplification function; a signal filtering function; a signal resampling function; a dejittering function; a data storage function; a clock generation function; and a phase alignment function.

15. An electronic device testing system comprising:
a load board comprising a first array of contacts;
a device under test (DUT) comprising a second array of contacts; and
a test interposer comprising:
an integrated circuit package comprising:
a first surface and a second surface, the first surface facing the first array of contacts and the second surface facing the second array of contacts;
a third array of contacts disposed at the first surface, each contact of the third array of contacts electrically coupled to a corresponding contact of the first array of contacts;
a fourth array of contacts disposed at the second surface, each contact of the fourth array of contacts electronically coupled to a corresponding contact of the second array of contacts;
a first die;
a second die separate from the first die;
an active circuit component disposed at the first die and coupled to a first contact of the third array of contacts and to a second contact of the fourth array of contacts; and
an encapsulant overlying the first die, the second die, and the active circuit component.

16. The electronic device testing system of claim 15, wherein the fourth array of contacts comprises one selected from a group consisting of: an array of metal bumps; an array of metal balls; an array of metal columns; an array of recessed contacts; an array of micro-electrical-mechanical system (MEMS) probes; and an array of metal-filled columns.

17. The electronic device testing system of claim 15, wherein the active circuit component comprises one selected from a group consisting of: a memory component; a microprocessor component; a digital signal processor component;

an analog-to-digital (A/D) converter; an application specific integrated circuit (ASIC); and a field programmable logic array (FPGA).

18. The electronic device testing system of claim 15, wherein:

the third array of contacts is arranged to have a first contact pitch; and the fourth array of contacts is arranged to have a second contact pitch, the second contact pitch smaller than the first contact pitch.

19. The electronic device testing system of claim 15, wherein:

the first die comprises a set of die pads disposed at a surface of the first die; and the test interposer further comprises an interconnects to connect a die pad of the set of die pads to at least one of a contact of the first array of contacts or a contact of the third array of contacts.

20. The electronic device testing system of claim 15, wherein the encapsulant comprises an epoxy molding compound.

* * * * *